United States Patent
Mikulic et al.

(10) Patent No.: US 10,742,200 B2
(45) Date of Patent: Aug. 11, 2020

(54) OSCILLATOR CIRCUIT AND METHOD FOR GENERATING A CLOCK SIGNAL

(71) Applicant: ams AG, Premstaetten (AT)

(72) Inventors: Josip Mikulic, Graz (AT); Gregor Schatzberger, Graz (AT)

(73) Assignee: ams AG, Premstaetten (AT)

( * ) Notice: Subject to any disclaimer, the term of this patent is extended or adjusted under 35 U.S.C. 154(b) by 0 days.

(21) Appl. No.: 16/341,112

(22) PCT Filed: Oct. 19, 2017

(86) PCT No.: PCT/EP2017/076700
§ 371 (c)(1),
(2) Date: Apr. 11, 2019

(87) PCT Pub. No.: WO2018/077719
PCT Pub. Date: May 3, 2018

(65) Prior Publication Data
US 2020/0044629 A1    Feb. 6, 2020

(30) Foreign Application Priority Data

Oct. 28, 2016    (EP) ..................................... 16196391

(51) Int. Cl.
*H03K 3/0231*    (2006.01)
*H03K 3/027*    (2006.01)
(Continued)

(52) U.S. Cl.
CPC ........... *H03K 3/027* (2013.01); *H03K 3/0231* (2013.01); *H03K 5/133* (2013.01); *H03K 5/135* (2013.01); *H03L 7/099* (2013.01)

(58) Field of Classification Search
CPC ......... H03K 3/0231; H03K 3/027; H03K 4/50
(Continued)

(56) References Cited

U.S. PATENT DOCUMENTS

| | | | |
|---|---|---|---|
| 8,054,141 B2 | 11/2011 | Saw | |
| 2007/0279137 A1* | 12/2007 | Molina | H03K 3/011 |
| | | | 331/111 |
| 2014/0375392 A1* | 12/2014 | Sinitsky | H03K 3/0231 |
| | | | 331/111 |

FOREIGN PATENT DOCUMENTS

| | | |
|---|---|---|
| CN | 102811054 | 12/2012 |
| CN | 105720946 | 6/2016 |
| WO | 2013/004072 | 1/2013 |

OTHER PUBLICATIONS

European Patent Office, International Search Report for PCT/EP2017/076700 dated Feb. 12, 2018.
(Continued)

*Primary Examiner* — Levi Gannon
(74) *Attorney, Agent, or Firm* — Fish & Richardson P.C.

(57) ABSTRACT

In an embodiment an oscillator circuit comprises a first integrator-comparator unit, a second integrator-comparator unit, and a logic circuit. The first integrator-comparator unit is prepared to provide a first signal as a function of a first integration of a first charging current and a subsequent comparison of a first integration signal resulting from the first integration with a reference signal. The second integrator-comparator unit is prepared to provide a third signal as a function of a second integration of a second charging current and a subsequent comparison of a second integration signal resulting from the second integration with the reference signal. The logic circuit is adapted to provide a clock signal, a first and a second measurement signal for respectively controlling the first and the second integrator-comparator unit.

16 Claims, 7 Drawing Sheets

(51) Int. Cl.
  *H03K 5/133*  (2014.01)
  *H03K 5/135*  (2006.01)
  *H03L 7/099*  (2006.01)
(58) Field of Classification Search
  USPC .......................................................... 331/143
  See application file for complete search history.

(56) References Cited

OTHER PUBLICATIONS

Wang et al., "255nW 138kHzRC Oscillator for Ultra-low Power Applications", IEEE MTT-S International Wireless Symposium (IWS), IEEE pp. 1-4 (2016).

* cited by examiner

OSCILLATOR CIRCUIT AND METHOD FOR GENERATING A CLOCK SIGNAL

BACKGROUND

The disclosure relates to an oscillator circuit and a method for generating a clock signal.

Oscillators are one of the basic building blocks of every digital and mixed-signal circuit. In many applications the performance of the circuit is highly dependent on the performance of the oscillator, requiring low frequency drift over the temperature, low jitter and high power supply rejection ratio. In addition, low power consumption is often required. Quartz oscillators offer a great frequency precision. However, their temperature range is usually limited to 125° C. In addition, they are not suitable for the full on-chip solutions, because they require an external component, namely the quartz, which implies high production cost.

A so-called relaxation oscillator is therefore commonly used instead of a quartz oscillator. The present application starts out from a well-known conventional saw-tooth relaxation oscillator which is depicted in FIG. 6. The oscillator has two integrator blocks 10, 20. The integrator block 10 comprises two switches 11, 12, an inverter 13, a capacitor 14, a comparator 15 and a current source 16. The integrator block 20 has two switches 21, 22, an inverter 23, a capacitor 24, a comparator 25 and a current source 26. The integrator blocks 10 and 20 are presumed identical in terms of the composition and all electrical properties. The outputs A and B of the comparators 15 and 25 control an SR flip-flop 30, which provides the signals CLK1 and CLK2 at its outputs. The signals CLK1 and CLK2 control the switches 11 and 12 of the integrator block 10 and switches 21 and 22 of the integrator block 20. It is assumed that the voltage reference VREF and the current reference IREF are provided by means of a reference generator block which is not shown in the schematics.

The operation of the circuit depicted in FIG. 6 is described with reference to FIG. 7, which shows typical waveforms of the voltages of the relevant nodes of the circuit diagram. At the beginning, the output voltages of the SR flip-flop 30, CLK1 and CLK2, are presumed high and low, respectively. The capacitors 14 and 24 are completely discharged. The output voltages A and B of the comparators 15 and 25 are both set to ground. Consequently, switches 11 and 22 are open, while switches 12 and 21 are closed. This ensures that the voltage V1 across the capacitor 14 is held at the ground level, while the capacitor 24 is being charged with the current IREF from the current source 21, linearly increasing the voltage V2 with a slew rate equal to the quotient of the current IREF and the capacitance value C of capacitor 24. At the moment ta, when the voltage V2 reaches the reference voltage VREF, the output current of the comparator 25 starts to charge the parasitic capacitances at its output B. The voltage at output B reaches a threshold voltage VTHR, representing the switching level of comparator 25, after a delay time td. This corresponds to the moment tb. At the moment tb, the reset signal of the SR flip-flop 30 is activated and the state of the flip-flop changes. Consequently, the voltage CLK1 changes its state from high to low, while the voltage CLK2 changes its state from low to high. All switches change their state as a result of change of the control voltages CLK1 and CLK2. The switches 11 and 22 change from open state to closed, while the switches 12 and 21 change from closed state to open. Therefore, the voltage V2 is discharged to the ground level, while the capacitor 14 starts to charge with the current IREF from the current source 16, rendering a slew rate of the voltage V1 equal to the quotient of the current IREF and the capacitance value C of capacitor 14. Because of the complete symmetry of the two integrator blocks 10 and 20, the waveform of the voltage V1 from tb to te is equal to the waveform of the voltage V2 up to tb. Considering this, one complete cycle of the voltages V1 and V2 extends from the beginning to point in time te and is called period T'.

In order to calculate the period T' of the oscillation for the circuit in FIG. 6, it becomes clear from the waveform of the voltage V2, that the moment to is determined with the slew rate of the voltage V2 and the reference voltage VREF. Furthermore, the propagation delay of the comparator which corresponds to timespan td is added to a half-cycle duration of the relaxation oscillator. The half-cycle duration is then equal to:

$$\frac{T'}{2} = C * \frac{VREF}{IREF} + td \qquad (1)$$

wherein T' represents the period or cycle duration, VREF represents the reference voltage VREF, C represents the capacitance value C of the capacitor 14 or 24, IREF represents the current IREF and td represents the propagation delay td of the comparator 15 or 25.

The period is equal to:

$$\frac{T'}{2} = 2 * C * \frac{VREF}{IREF} + 2td \qquad (2)$$

which can also be written as:

$$T' = 2RC + 2td \qquad (3)$$

wherein R represents the reference value of the resistor R resulting from the quotient of the reference voltage VREF and the current IREF.

One drawback of the prior art solution shown in FIG. 6 is the influence of the comparator propagation delay td on the absolute value of the oscillation frequency. The propagation delay td adds an additional frequency drift over temperature, power supply and process variations. This impairs the overall precision of the oscillator.

In the prior art e.g. U.S. Pat. No. 8,054,141 B2 said issue of the comparator propagation delay has been addressed. FIG. 8 shows the simplified circuit diagram of a relaxation oscillator 500. The relaxation oscillator 500 includes an integrator 501, a duplicate integrator 502, two reference voltages Vhigh and Vlow, a comparator 503 and logic 504. Integrator 501 has current sources I1 and I2, switches SW1 and SW2 and capacitor Ca. Duplicate integrator 502 includes current sources I3, I4 and I5, switches SW3, SW4, SW5 and SW6 and capacitor Cb.

The operation of the relaxation oscillator depicted in FIG. 8 is based on the integrator 501 and the comparator 503. As the switches SW1 and SW2 operate in tandem, the capacitor Ca either charges or discharges, depending on the state of the logic 504. The comparator output changes the state of the logic 504 after the voltage Vcap reaches one of the reference voltages Vhigh or Vlow with a delay td. Meanwhile, a pulse with the duration of the delay td is extracted from the output of the comparator 503. This pulse controls the operation of the duplicate integrator 502, feeding the capacitor Cb with excess charge in order to cancel the delay of the comparator 302. As a result, the voltage on the capacitors Ca, Cb is shifted by the amount corresponding to the delay.

However, the precision of the delay cancelation shown in FIG. 8 is determined by the exactness of the propagation delay pulse duration, together with the matching of the current sources and the capacitors contained in the integrators 501 and 502. While the matching quality can be controlled and set to a desirable level, the exact extraction of the propagation delay pulse strongly depends on the process corners, symmetrical slew rates and the linear behavior of the comparator circuit. This entails a systematic error in the extraction of the delay pulse.

SUMMARY

In one embodiment an oscillator circuit has a first integrator-comparator unit, a second integrator-comparator unit and a logic circuit. The first integrator-comparator unit is prepared to provide a first signal as a function of a first integration of a first charging current and a subsequent comparison of a first integration signal resulting from the first integration with a reference signal. The first integrator-comparator unit is further prepared to provide a second signal which is complementary to the first signal. The second integrator-comparator unit is prepared to provide a third signal as a function of a second integration of a second charging current and a subsequent comparison of a second integration signal resulting from the second integration with the reference signal. The second integrator-comparator unit is further prepared to provide a fourth signal which is complementary to the third signal. The logic circuit is adapted to provide a clock signal, a first and a second measurement signal for respectively controlling the first and the second integrator-comparator unit. The first measurement signal is provided as a function of the second signal and the clock signal. The second measurement signal is provided as a function of the fourth signal and the clock signal and the clock signal is provided as a logic function of the first signal and the third signal.

The first charging current is integrated in the first integrator-comparator unit resulting in the first integration signal. The first integration signal is compared to the reference signal and the result of this comparison is reflected in the first signal. The second signal is provided such that it is complementary to the first signal. Likewise, the second charging current is integrated in the second integrator-comparator unit resulting in the second integration signal. The second integration signal is also compared to the reference signal and the result of this comparison is reflected in the third signal. The fourth signal is provided such that it is complementary to the third signal. The logic circuit receives the first, second, third and fourth signal and therefrom provides by combining these signals as detailed above the first and second measurement signal, as well as the clock signal. The first and second measurement signal and the clock signal are respectively used to control the first and the second integrator-comparator unit.

Provisioning of the first and the second signal which are complementary to each other and reflect the comparison of the first integration signal with the reference signal, provisioning of third and the fourth signal which are complementary to each other and reflect the comparison of the second integration signal with the reference signal and subsequent combination of these signals enables exact determination of a delay of the comparison in the first and the second integrator-comparator unit. This duration is reflected in the first and second measurement signal. Feedback of the first and second measurement signal and the clock signal allows cancelling the influence of this delay on a period of the provided clock signal. Therefore, the proposed oscillator circuit is more precise and less sensitive to temperature changes.

The suggested oscillator circuit can also be called a relaxation oscillator.

In a development the second integrator-comparator unit is controlled to perform the second integration in counter-phase to the first integration.

This means that in a first half-period of a cycle of the clock signal provided by the oscillator circuit, the first integrator-comparator unit is performing the integration until the first integration signal becomes equal to the reference signal which triggers changing the state of the clock signal. The integration is then performed in a second half-period in the second integrator-comparator unit until the second integration signal surpasses the reference signal which again triggers changing the state of the clock signal.

This cycle repeats. The first half-period of the cycle can be referred to as the first phase and the second half-period of the cycle can be designated the second phase. Consequently, first and second integrator-comparator units are controlled to perform the integration in counter-phase to each other.

In a further development a width of an impulse of the first measurement signal is proportional to a propagation delay of the comparison within the first integrator-comparator unit. A width of an impulse of the second measurement signal is proportional to a propagation delay of the comparison within the second integrator-comparator unit.

The first measurement signal depends on the first and the second signal supplied by the first integrator-comparator unit. The second measurement signal depends on the third and the fourth signal supplied by the second integrator-comparator unit in counter-phase to the supply of the first and the second signal. The resulting time shift between an impulse of the first measurement signal and an impulse of the second measurement signal enables a time-shifted feedback of the propagation delay and efficient cancelling of its influence on the clock signal.

In an embodiment a value of the first charging current and a value of the second charging current is respectively adjusted under control of the logic circuit by means of the first and the second measurement signal and the clock signal.

Adjustment of respective values of first and second charging currents allows determination of the propagation delay reflected in the first and second measurement signal with high accuracy.

In a development the first integrator-comparator unit comprises a first charger component, a first capacitor, a first comparator and a second comparator. A noninverting input of the first comparator is coupled to an inverting input of the second comparator, thereby forming a first integration node. An inverting input of the first comparator and a noninverting input of the second comparator are supplied with the reference signal. The first capacitor is connected between the first integration node and a reference potential terminal. The first charger component is switchably coupled to the first integration node. The first comparator is prepared to provide the first signal. The second comparator is prepared to provide the second signal.

First and second comparator are dimensioned substantially identical. The second comparator consequently represents a replica or a duplicate with respect to the first comparator. Due to the coupling of the two comparators and the supply of the reference signal as defined above, the comparators operate with inverted phase to each other. Therefore, first and second signals are complementary to each other.

In a further development the first charger component comprises a first switch, a second switch, a third switch and a fourth switch, as well as a first current source coupled between a supply potential terminal and the first integration node by means of the first switch, a second current source coupled between the supply potential terminal and the first integration node by means of the second switch, and a third current source coupled between the first integration node and the reference potential terminal by means of the fourth switch. The first integration node is coupled to the reference potential terminal by means of the third switch. The first charger component is prepared to provide the first charging current.

First, second and third current sources are each dimensioned to provide a current with a different amount with respect to a reference current.

In a development the first switch is controlled by the clock signal in its inverted form, the second switch is controlled by the second measurement signal, the third switch is controlled as a function of the first measurement signal and the clock signal in its inverted form, and the fourth switch is controlled by the first measurement signal.

The switches of the first charger component are controlled by the first and second measurement signal, as well as by the clock signal. In cooperation with the three current sources, the value of the first charging current is adjusted. The first integration signal corresponds to a voltage across the first capacitor, for instance. The reference signal represent a reference voltage, for example. By means of the adjustable first charging current, a slew rate of the first integration signal is adjusted. Thereby, the exactness of the determination of the propagation delay of the first and the second comparator is greatly improved.

The propagation delay of a comparator therein refers to the amount of time between the point in time at which the value of the integration signal reaches the value of the reference signal and the point in time at which the output of the comparator reaches a threshold level representing a switching level of the comparator. As soon as the output of the comparator exceeds the threshold level, it changes the output value from low to high or from high to low depending on the previous value of the output.

In a further embodiment the second integrator-comparator unit comprises a second charger component, a second capacitor, and a third comparator and a fourth comparator. A noninverting input of the third comparator is coupled to an inverting input of the fourth comparator thereby forming a second integration node. An inverting input of the third comparator and a noninverting input of the fourth comparator are supplied with the reference signal. The second capacitor is connected between the second integration node and the reference potential terminal. The second charger component is switchably coupled to the second integration node. The third comparator is prepared to provide the third signal, and the fourth comparator is prepared to provide the fourth signal.

Third and fourth comparator are dimensioned substantially identical. The fourth comparator consequently represents a replica or a duplicate with respect to the third comparator. Due to the coupling of the two comparators and the supply of the reference signal as defined above, the comparators operate with inverted phase to each other. Therefore, third and fourth signals are complementary to each other.

Furthermore, the first and the second integrator-comparator unit are dimensioned substantially equal in terms of their composition and electrical properties.

In a development the second charger component comprises a fifth switch, a sixth switch, a seventh switch and an eighth switch, as well as a fourth current source coupled between the supply potential terminal and the second integration node by means of the fifth switch, a fifth current source coupled between the supply potential terminal and the second integration node by means of the sixth switch, and a sixth current source coupled between the second integration node and the reference potential terminal by means of the eighth switch. The second integration node is coupled to the reference potential terminal by means of the seventh switch. The second charger component is prepared to provide the second charging current.

Fourth, fifth and sixth current sources are each dimensioned to provide a current with a different amount with respect to a reference current.

In a development the fifth switch is controlled by the clock signal. The sixth switch is controlled by the first measurement signal. The seventh switch is controlled as a function of the second measurement signal and the clock signal. The eighth switch is controlled by the second measurement signal.

The switches of the second charger component are controlled by the first and second measurement signal, as well as by the clock signal. In cooperation with the three current sources, the value of the second charging current is adjusted. The second integration signal corresponds to a voltage across the second capacitor, for instance. By means of the adjustable second charging current, a slew rate of the second integration signal is adjusted. Thereby, the exactness of the determination of the propagation delay of the third and the fourth comparator is greatly improved.

By using replica comparators, the propagation delay of the comparators in the first and the second integrator-comparator unit is measured up to the level determined by the matching of the comparators without introducing a systematic error. Furthermore, the propagation delay of the comparators is canceled up to the level determined by the matching of the current sources. In addition, the structure of the proposed relaxation oscillator circuit offers complete cancelation of the systematic offset of the comparators. For the propagation delay cancelation other than non-ideal behavior of the switches and influence of the parasites—both of which can be minimized by careful design—the proposed oscillator circuit has no systematic errors or dependencies on the process variations. Therefore, the frequency precision of the generated clock signal is mainly influenced by the mismatch parameters which can be well controlled with the invested area and the precision of the references, e.g. first and second capacitor and the reference resistor resulting from the quotient of reference voltage and reference current.

In a development the logic circuit comprises a flip-flop which is prepared to receive the first and the third signal on its inputs and to provide the clock signal.

In a further development the logic circuit also comprises a first logic component which is prepared to receive the second signal and the clock signal and to provide the first measurement signal, and a second logic component. The second logic component is prepared to receive the fourth signal and the clock signal in its inverted form and to provide the second measurement signal.

In one embodiment a method for generating a clock signal has the following steps:

Integrating a first charging current in a first integration, comparing a first integration signal resulting from the first integration with a reference signal and therefrom providing a first signal, providing a second signal which is complementary to the first signal, integrating a second charging current in a second integration, comparing a second integration signal resulting from the second integration with the reference signal and therefrom providing a third signal, providing a fourth signal which is complementary to the third signal, providing a clock signal as a logic function of the first and the third signal, providing a first measurement signal as a function of the clock signal with the second signal, providing a second measurement signal as a function of the clock signal and the fourth signal, and controlling the first integration and the second integration by means of the clock signal, the first and the second measurement signal.

The proposed method can be implemented, for example, using the oscillator circuit defined above.

The proposed method offers exact determination of the propagation delay of each comparing step and subsequent cancelling of this delay by means of a feedback control of the integration. The clock signal is consequently provided in a temperature-stable manner.

The integrating the first charging current can be performed, for instance, by charging a first capacitor with the first charging current. A voltage across said capacitor consequently represents the first integration signal. Similarly, integrating the second charging current can be performed, for instance, by charging a second capacitor with the second charging current. A voltage across said capacitor consequently represents the second integration signal. The provisioning of a signal as a function of one or more other signals can be realized by logically combining said one or more other signals.

In a development the first integration is performed in counter-phase to the second integration under control of the clock signal.

In a development the first measurement signal changes its state as soon as the first signal surpasses a threshold level and subsequently changes its state again as soon as the second signal surpasses the threshold level such that a duration of an impulse of the first measurement signal is proportional to a propagation delay of the comparing the first integration signal with the reference signal. The second measurement signal changes its state as soon as the third signal surpasses the threshold level and subsequently changes its state again as soon as the fourth signal surpasses the threshold level such that a duration of an impulse of the second measurement signal is proportional to a propagation delay of the comparing the second integration signal with the reference signal.

In a development a value of the first charging current is adjusted under control of the first and the second measurement signal and the clock signal in its inverted form such that a slew rate of the first integration signal between a point in time at which the first integration signal surpasses the reference signal and the point in time at which the clock signal changes its state is adjusted to a slew rate of the first integration signal between the point in time at which the clock signal changes its state and a point in time at which the first integration signal falls below the reference signal. A value of the second charging current is adjusted under control of the first and the second measurement signal and the clock signal such that a slew rate of the second integration signal between a point in time at which the second integration signal surpasses the reference signal and the point in time at which the clock signal changes its state is adjusted to a slew rate of the second integration signal between the point in time at which the clock signal changes its state and a point in time at which the second integration signal falls below the reference signal.

BRIEF DESCRIPTION OF THE DRAWINGS

The text below explains the proposed oscillator circuit and corresponding method in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures.

DETAILED DESCRIPTION

Figure 1:
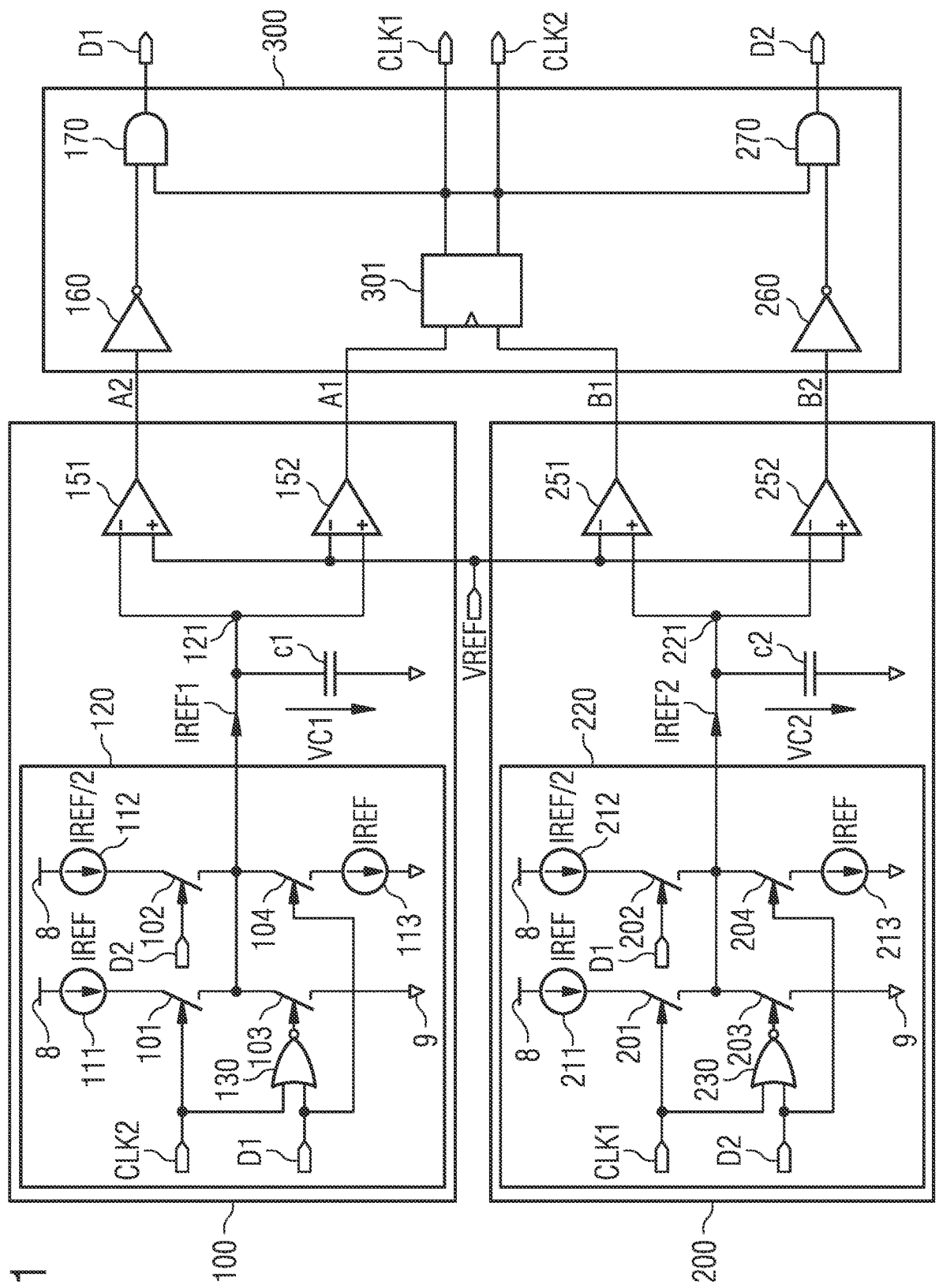
FIG. 1 shows an embodiment example of the proposed oscillator circuit.

FIG. 1 shows an embodiment example of the proposed oscillator circuit. The oscillator circuit comprises a first integrator-comparator unit 100, a second integrator-comparator unit 200 and a logic circuit 300.

The first integrator-comparator unit 100 comprises a first charger component 120, a first capacitor C1, a first comparator 151 and a second comparator 152. The first charger component 120 comprises a first switch 101, a second switch 102, a third switch 103, a fourth switch 104 and a NOR gate 130. The first charger component 120 further comprises a first current source 111 for providing a reference current IREF, a second current source 112 for providing a current with half of the value of the reference current IREF provided by the first current source 111, and a third current source 113 for providing the reference current IREF with a value corresponding to the value of the reference current IREF provided by the first current source 111. The first current source 111 is coupled between a supply potential terminal 8 and a first integration node 121 by means of the first switch 101. The second current source 112 is coupled between the supply potential terminal 8 and the first integration node 121 by means of the second switch 102. The third current source 113 is coupled between the first integration node 121 and a reference potential terminal 9 by means of the fourth switch 104. The first integration node 121 is coupled to the reference potential terminal 9 by means of the third switch 103.

A noninverting input of the first comparator 151 is coupled to an inverting input of the second comparator 152, thereby forming the first integration node 121. An inverting input of the first comparator 151 and a noninverting input of the second comparator 152 are supplied with a reference signal VREF. The first capacitor C1 is connected between the first integration node 121 and the reference potential terminal 9. The first charger component 120 is coupled to the first integration node 121 in a switchable manner by means of first, second, third and fourth switches 101, 102, 103, 104.

The first charger component 120 provides the first charging current IREF1 causing a first integration signal VC1 which is represented as a voltage drop across the first capacitor C1. The first comparator 151 provides a first signal A1, whereas the second comparator 152 provides a second signal A2.

The second integrator-comparator unit comprises a second charger component 220, a second capacitor C2, a third comparator 251 and a fourth comparator 252. A noninverting input of the third comparator 251 is coupled to an inverting input of the fourth comparator 252, thereby forming a second integration node 221. An inverting input of the third comparator 251 and a noninverting input of the fourth comparator 252 are supplied with the reference signal VREF. The second capacitor C2 is connected between the second integration node 221 and the reference potential terminal 9. The second charger component 220 comprises a fifth switch 201, a sixth switch 202, a seventh switch 203 and an eighth switch 204 and a NOR gate 230. The second charger component 220 further comprises a fourth current source 211, a fifth current source 212 and a sixth current 213. The fourth current source 211 is coupled between the supply potential terminal 8 and the second integration node 221 by means of the fifth switch 201. The fifth current source 212 is coupled between the supply potential terminal 8 and the second integration node 221 by means of the sixth switch 202. The sixth current source 213 is coupled between the second integration node 221 and the reference potential terminal 9 by means of the eighth switch 204. The second integration node 221 is coupled to the reference potential terminal 9 by means of the seventh switch 203. The second charger component 220 is coupled to the second integration node 221 in a switchable manner by the fifth, the sixth, the seventh and the eighth switch 201, 202, 203 and 204.

The second charger component 220 provides a second charging current IREF2 causing a second integration signal VC2 which is represented as a voltage drop across the second capacitor C2. The third comparator 251 provides a third signal B1, whereas the fourth comparator 252 provides a fourth signal B2.

The logic circuit 300 comprises a flip-flop 301 which may be realized by an SR flip-flop, a first logic component 160, 170 and a second logic component 260, 270. The flip-flop 301 receives the first signal A1 on its set input and the third signal B1 on its reset input. The flip-flop 301 consequently provides at its Q output a clock signal CLK1 and optionally at its negated Q output an inverted form of the clock signal CLK1, the inverted form being designated CLK2. The first logic component is implemented in this example by an inverter 160 and an AND gate 170 connected downstream to the inverter 160. The inverter 160 receives the second signal A2. The AND gate 170 additionally receives the clock signal CLK1 and provides a first measurement signal D1 from the AND combination of the inverted or negated second signal A2 and the clock signal CLK1. The second logic component comprises an inverter 260 and an AND gate 270 coupled downstream to the inverter 260. The inverter 260 receives the fourth signal B2. The AND gate 270 combines the inverted clock signal CLK2 and the inverted fourth signal B2 and therefrom provides a second measurement signal D2.

The first switch 101 is controlled by the inverted clock signal CLK2. The second switch 102 is controlled by the second measurement signal D2. The third switch 103 is controlled as a function of the first measurement signal D1 and the inverted clock signal CLK2 which are combined in the NOR gate 130. The fourth switch 104 is controlled by the first measurement signal D1.

The fifth switch 201 is controlled by the clock signal CLK1. The sixth switch 202 is controlled by the first measurement signal D1. The seventh switch 203 is controlled as a function of the second measurement signal D2 and the clock signal CLK1 which are combined for instance in the NOR gate 230. The eighth switch 204 is controlled by the second measurement signal D2.

It is assumed that the reference signal VREF, for instance a reference voltage and the reference current IREF used in the current sources 111, 112, 113, 211, 212 and 213 are provided within a reference generator block which is well-known to those skilled in the art and is therefore not shown in the schematics.

The operation of the circuit is described in the following with reference to FIGS. 2, 3, 4 and 5.

Figure 2:
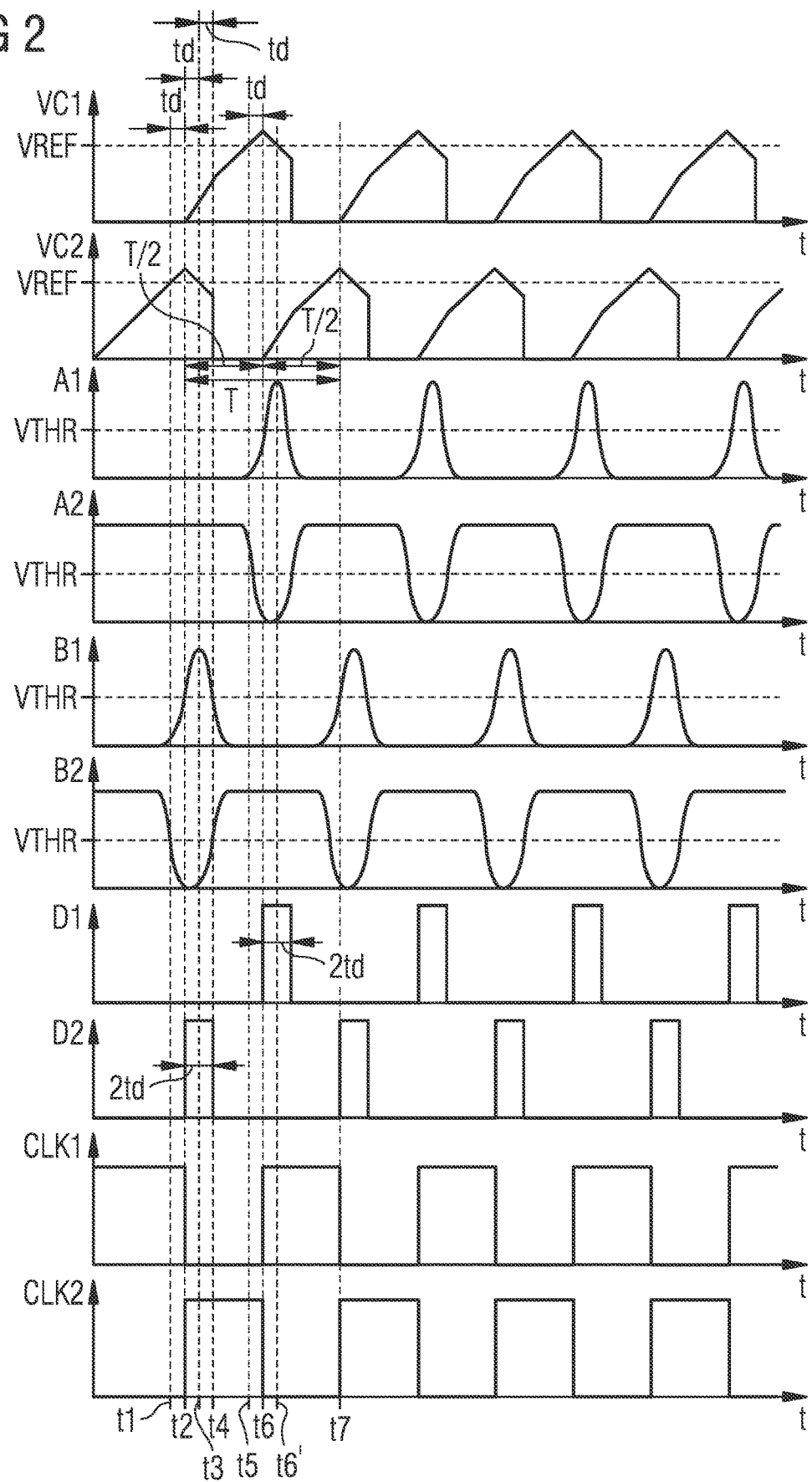
FIG. 2 shows exemplary timing diagrams for the proposed oscillator circuit.

FIG. 2 shows exemplary timing diagrams for the proposed oscillator circuit. The depicted waveforms denote the relevant signals of FIG. 1 which for this example are represented as voltages. The lines show from top to bottom the first integration signal or voltage VC1 across the first capacitor C1, the second integration signal or voltage VC2 across the second capacitor C2, the first signal A1 or voltage A1 at the output of first comparator 151, the second signal A2 or voltage at the output of the second comparator 152, the third signal B1 or voltage at the output of the third comparator 251, the fourth signal B2 or voltage at the output of fourth comparator 252, the first measurement signal D1, the second measurement signal D2, the clock signal CLK1 or voltage at the Q output of flip-flop 301 and the inverted clock signal CLK2 or voltage at the inverted Q output of flip-flop 301.

At the beginning, the clock signal CLK1 output by the flip-flop 301 is presumed high, and the inverted clock signal CLK2 is presumed low. The capacitors C1 and C2 are completely discharged. As a consequence, output voltages of the comparators 152 and 252 which are represented by signals A2 and B2, respectively, are set to high level, hence the outputs of the inverters 160 and 260 are set to low level. Output voltages of the comparators 151 and 251 which are represented by signals A1 and B1 are both set to ground or reference potential. Therefore, first and second measurement signal D1 and D2 are at ground potential or level. The NOR gate 130 has a high level at its output, while the NOR gate 230 has a low level at its output. Consequently, the switches 101, 102, 104, 202, 203 and 204 are open, while the switches 103 and 201 are closed. This ensures that the first integration signal represented by voltage VC1 across the first capacitor C1 is held at the ground level, while the second capacitor C2 is being charged with the second charging current IREF2 which is provided by the current source 211 with the value of the reference current IREF. The second integration signal VC2 increases linearly with a slew rate equal to the quotient of the value of the reference current IREF and the value of the capacitance C of the second capacitor C2.

At the moment t1, when the voltage VC2 reaches the reference voltage VREF, the output current of the comparator 251 starts to charge the parasitic capacitances at its output and the voltage B1 increases. On the other hand, the output node B2 of the comparator 252 starts to discharge. The third signal B1 reaches the switching level of the third comparator 251, the switching level being called threshold signal VTHR and corresponding to a threshold voltage VTHR, after a delay time td at the point in time t2. At that moment, the reset signal of the SR flip-flop 301 is activated and the state of the flip-flop 301 changes. This means that the clock signal CLK1 is set to low level, while the inverted clock signal CLK2 is set to high level.

Therein the output voltage B2 of the comparator 252 is still below the threshold voltage VTHR at the moment t2. For this purpose a small systematic offset voltage VOFF is added at the inputs of the comparators such that the output voltage B1 of the comparator 251 starts to charge slightly after the integration signal VC2 reaches the reference voltage VREF at point in time t1, and the output voltage B2 of the comparator 252 starts to discharge slightly before the integration signal VC2 reaches the reference voltage VREF. The effect of the offset voltage VOFF and the resulting offset time on a period T of the clock signal CLK1 is canceled during the operation, as it is described later in detail, and therefore will be neglected in the following timing analysis.

At point in time t2, the state of the clock signals CLK1 and CLK2 changes, respectively. With the fourth signal B2 at the low level, the change of the inverted clock signal CLK2 triggers the change of the output of the AND gate 270 representing the second measurement signal D2 from low to high voltage level. The change in the second measurement signal D2 triggers the change of switches 102 and 204. The change of the clock signals CKL1 and CLK2 triggers the change of switches 101, 103 and 201. This means that the switch 103 at the moment t2 goes from closed to open state disconnecting the first capacitor C1 from the reference potential 9. The switches 101 and 102 change from open to closed state, effectively connecting the first capacitor C1 to the current sources 111 and 112. The voltage VC1 increases linearly, with a slew rate equal to the quotient of one and a half times the reference current IREF and the capacitance C of the first capacitor C1. The switches 104, 202 and 203 remain open. The switch 201 changes state from closed to open and disconnects the current source 211 from the second capacitor C2. Simultaneously, the switch 204 is closed, which means that the current source 204 starts to discharge the second capacitor C2 with a slew rate equal to the quotient of the reference current IREF and the capacitance C. Because of the identical absolute values of the slew rates of the voltage VC2 around the moment t2, the voltage VC2 reaches the value of the reference voltage VREF again after the same delay time td at the moment t3. As the input terminals on the fourth comparator 252 are reversed with respect to the third comparator 251, at the moment t3 the fourth comparator 252 starts to enter the same phase as the third comparator 251 at the moment t1. Because of the matching conditions in the oscillator circuit as described above, the output voltage B2 reaches the high level after the same delay time td and sets the measurement signal D2 to the low level again. This makes the duration of the pulse of the measurement signal D2 equal to two times the delay time td.

With the change of the second measurement signal D2 from high to low at the moment t4, the switches 102 and 204 change from closed to open and the switch 203 changes from open to closed. The other switches 101, 103, 104, 201, and 202 remain unchanged. As a result, the voltage VC2 is discharged to the ground level and the first capacitor C1 continues to charge with the reference current IREF from the current source 111, making the slew rate of the voltage VC1 equal to the quotient of the reference current IREF and the capacitance C.

At the point in time t5 the voltage VC1 is equal to the reference voltage VREF. The charging of the first capacitor C1 continues until the moment t6 when the state of the flip-flop 301 is changed again and the first capacitor C1 subsequently starts to discharge.

At point in time t6' the first integration signal VC1 falls below the level of the reference voltage VREF.

At point in time t7 the next integration phase starts within the first integrator-comparator unit 100.

A duration of an impulse of the first and the second measurement signal D1, D2 is equal to twice the delay time td.

Because of the symmetry of the two integrator-comparator units 100 and 200, the waveform of the voltage VC1 from t6 to t7 is equal to the waveform of the voltage VC2 between t2 and t6. Considering this, one complete period cycle T of the voltages VC1 and VC2 is defined from point in time t2 to point in time t7. The same timeframe also defines one period T of the clock signals CLK1 and CLK2.

It can be seen that the start of a charging or integration phase within the first integrator-comparator unit 100 at point in time t2 triggers the start of a discharging phase in the second integrator-comparator unit 200. At the point in time t6 the start of a charging or integration phase within the second integrator-comparator unit 200 triggers the start of a discharging phase in the first integrator-comparator unit 100. The first integration which is reflected in the first integration signal or voltage VC1 is therefore performed in counter-phase to the second integration as reflected in the second integration signal or voltage VC2.

The switching level or threshold signal VTHR lies approximately half way between the supply potential and the reference potential. A logical high level corresponds to the level of a supply voltage, whereas a logical low level corresponds to ground potential. The reference voltage is dimensioned to satisfy the operating region of the current sources and the comparators.

Figure 3:
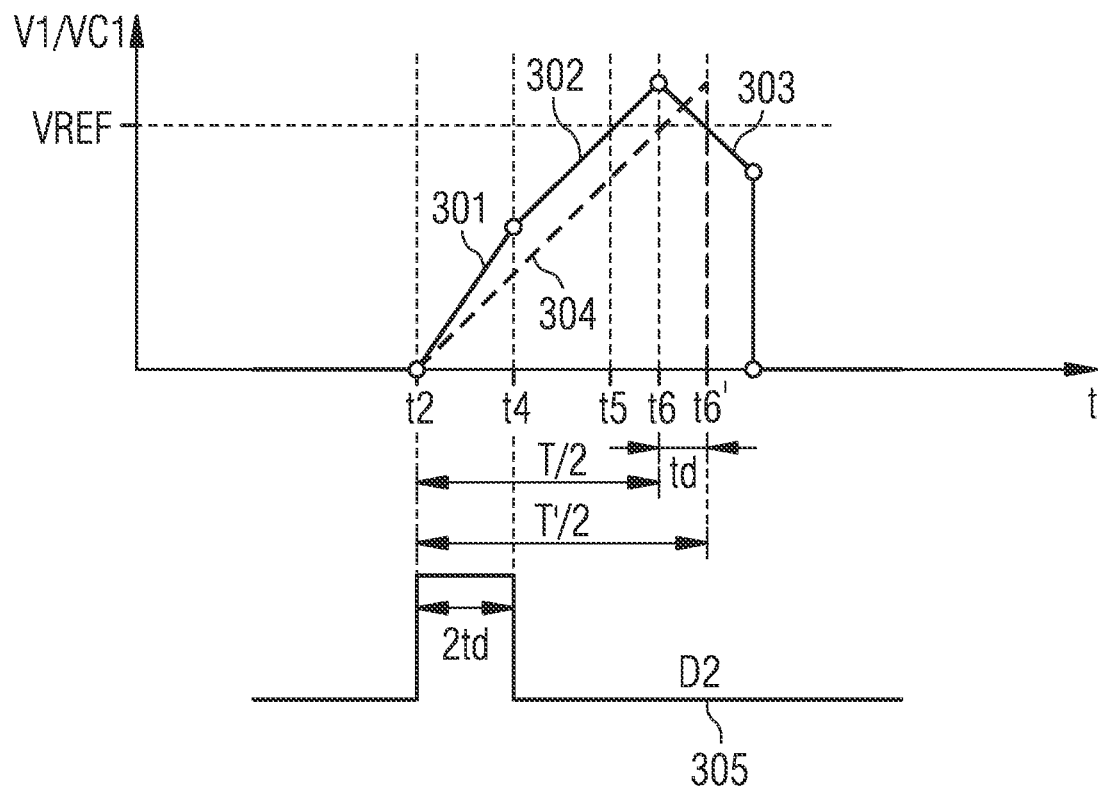
FIGS. 3 to 5 each show details of the timing diagrams of FIG. 2.
Figure 6:
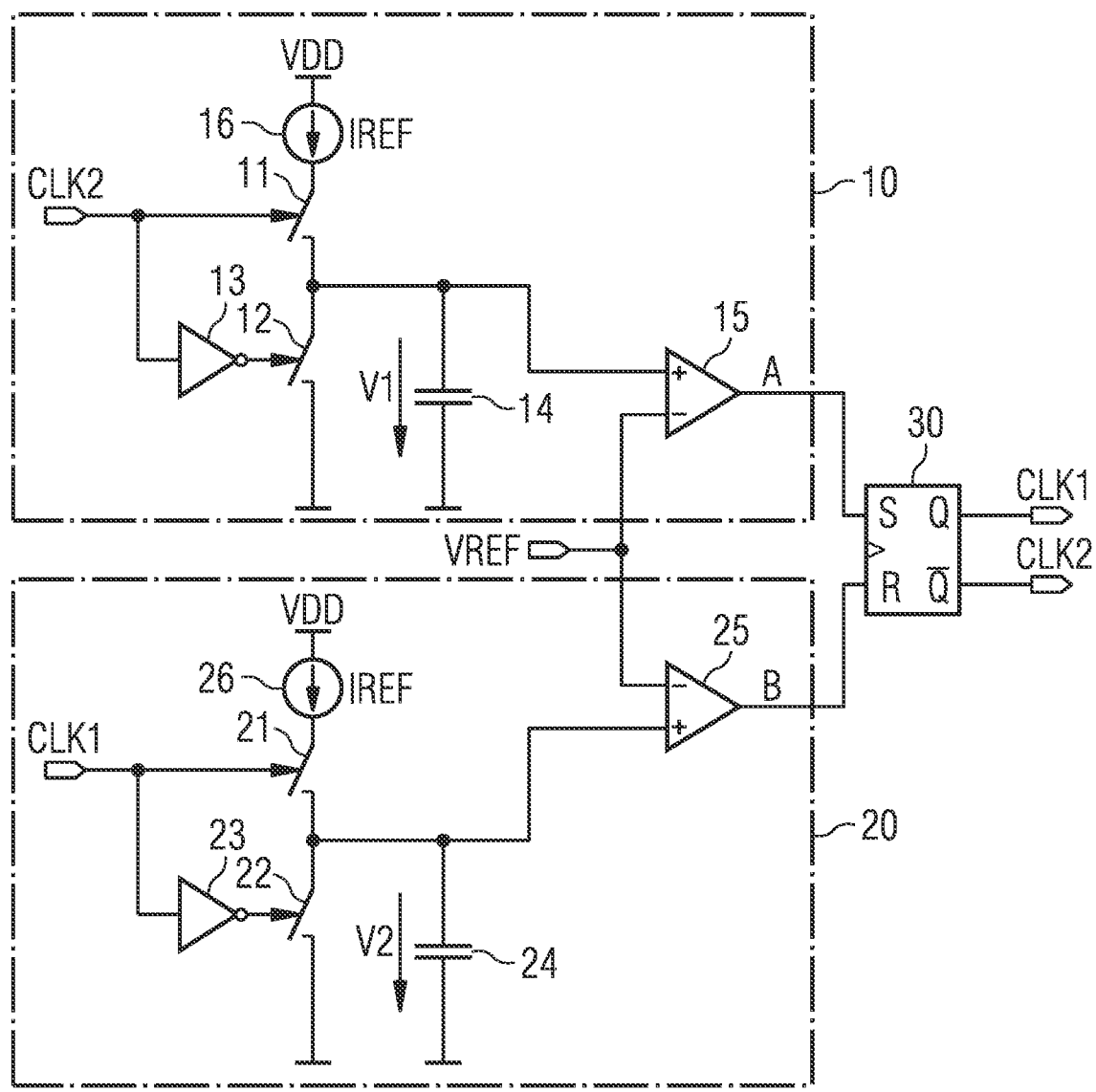
FIGS. 6 to 8 refer to prior art implementations of oscillators.
Figure 7:
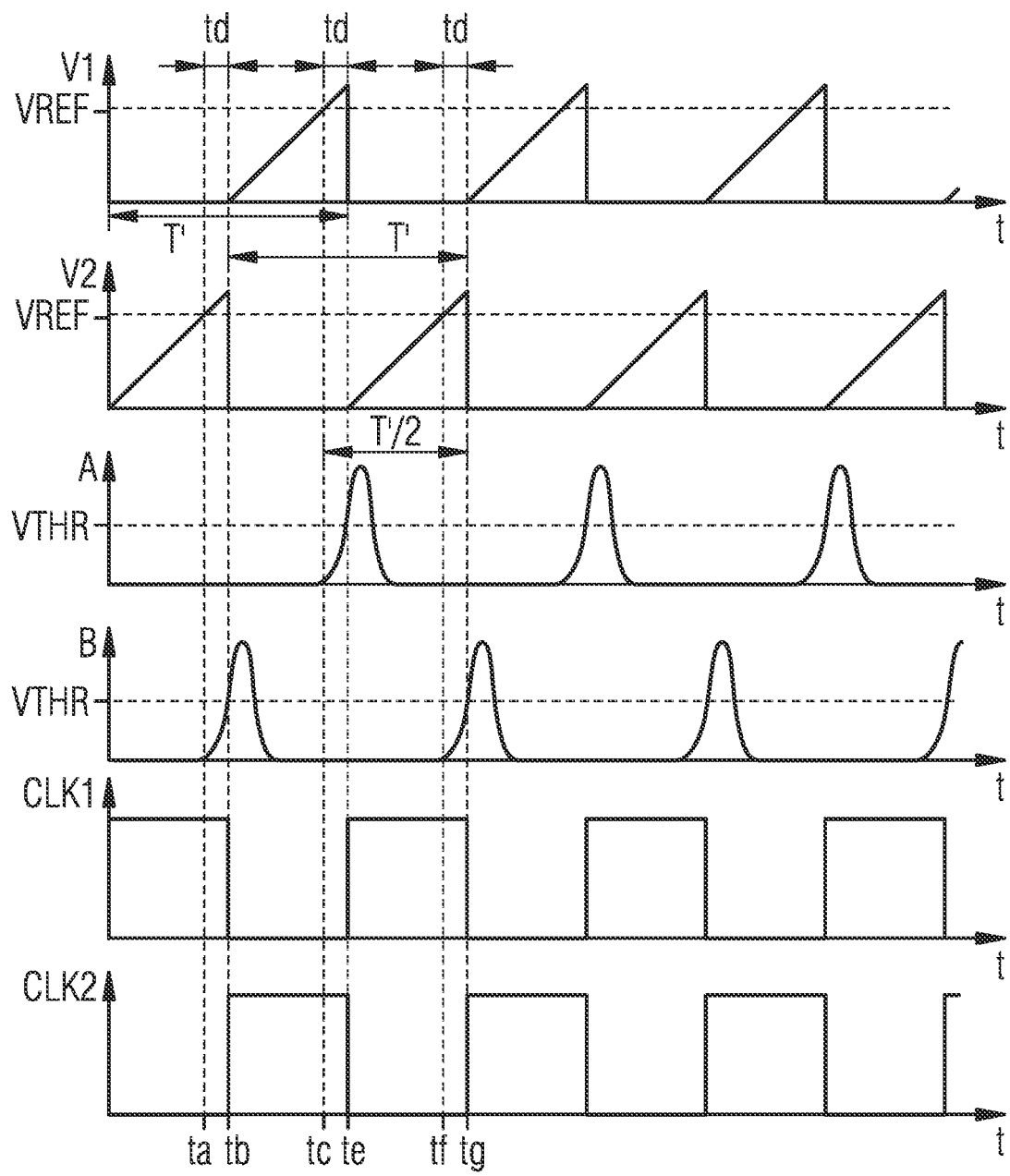
Figure 8:
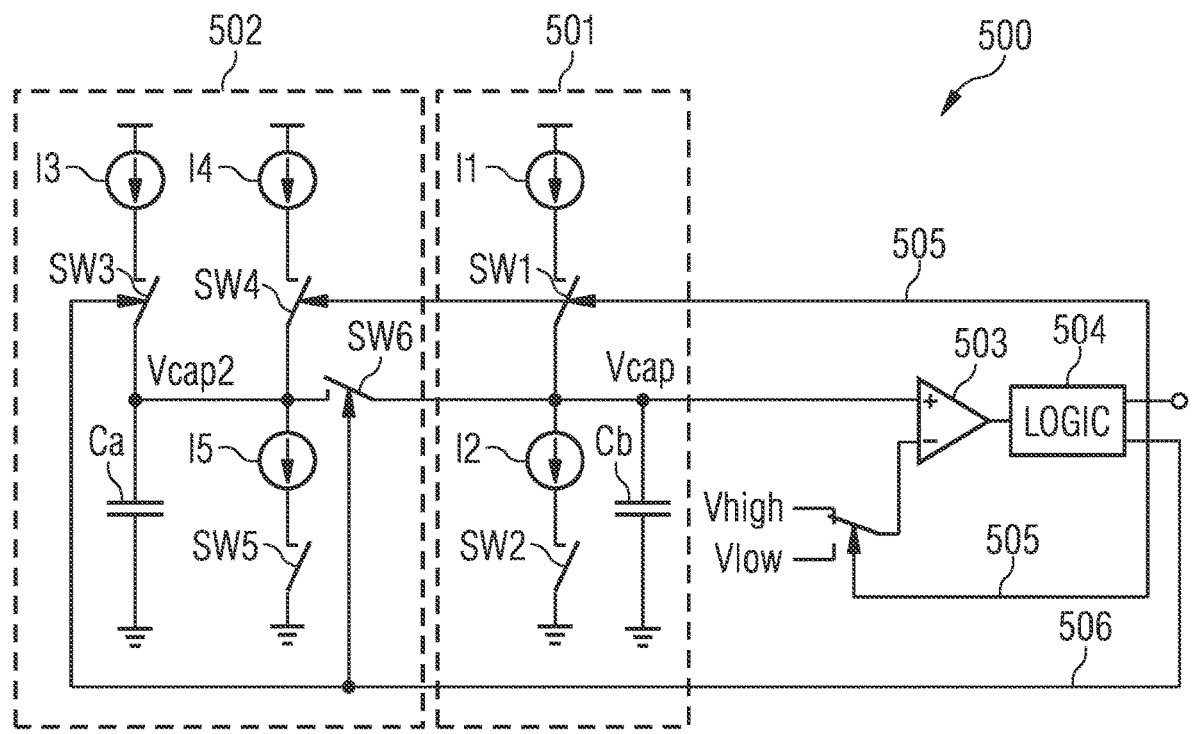

In FIG. 3 shows a comparative time diagram. A half-cycle of the voltage V1 from the state of the art oscillator of FIG. 6 is depicted by a dashed line 304. Also, a half-cycle of the proposed oscillator as of FIG. 1 is shown by a solid line having segments 301, 302 and 303. As already mentioned, the duration of the half-cycle 304 of the voltage V1 for the oscillator in FIG. 6 is defined in equation (1), with the period T' defined in equations (2) and (3).

The segments 301 and 302 of the voltage VC1 for the circuit diagram in FIG. 1 which determines the duration of the half-cycle differ from the half-cycle 304. The difference consists in the segment 301 from t2 to t4, where the slew rate of the voltage VC1 is equal to one and a half times the quotient of the reference current IREF and capacitance C. on the other hand the slew rate of segment 302 from t4 to t6 is equal to the quotient of the reference current IREF and capacitance C. Since the duration of the resulting pulse 305 of the measurement signal D2 is equal to two times the delay time td and the slew rate of segment 301 is increased by 50% compared to the slew rate of segment 302 and half-cycle 304, the total difference between the half-cycle durations of the state of the art, i.e. t6'−t2, and the proposed oscillator, i.e. t6−t2, amounts to the delay time td. In the proposed oscillator the half-cycle duration of the voltage VC1 is shorter for the delay time td compared to equation (1). The half-cycle duration of the proposed oscillator is therefore equal to:

$$\frac{T}{2} = C * \frac{VREF}{IREF}$$

wherein T represents the period or cycle duration, VREF represents the reference voltage VREF, C represents the capacitance value C of the first or the second capacitor C1 or C2 and IREF represents the current IREF.

The period is equal to:

$$\frac{T}{2} = 2*C*\frac{VREF}{IREF}$$

which can also be written as:

$$T=2RC$$

wherein R represents the reference value of the resistor R resulting from the quotient of the reference voltage VREF and the current IREF.

It turns out that the comparator propagation delay td is canceled with the proposed oscillator circuit. The period T of the clock signal CLK1 depends only on the passive components.

Figure 4:
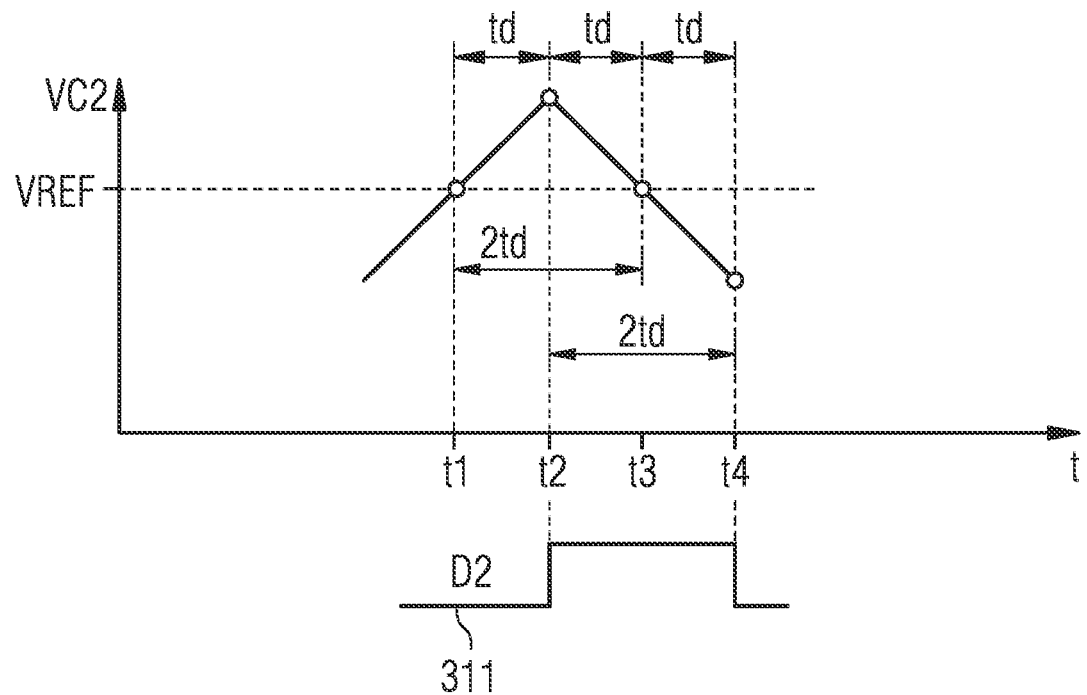

The cancelation of the systematic offset of the comparators is explained with reference to FIGS. 4 and 5. FIG. 4 shows the case when the comparator offset is not present. Voltage VC2 is shown, together with the pulse 311 of the measurement signal D2. Time td is defined as the difference between the moment t1 when the input of the comparator 251 reaches the reference voltage VREF and the moment t2 when the output voltage B1 of the comparator 251 reaches the logic threshold voltage VTHR. Because of the symmetry of the slew rates of the voltage VC2 around the moment t2, the difference between t3 and t2 is again equal to the delay time td. The input of the replica comparator 252 with inverted phase reaches the reference voltage VREF at the moment t3, and again the delay time td is needed until its output voltage B2 reaches the logic threshold voltage VTHR. In this way, the pulse of the measurement signal D2 is determined, with the duration equal to the difference between t3 and t1 which amounts to twice the delay time td.

Figure 5:
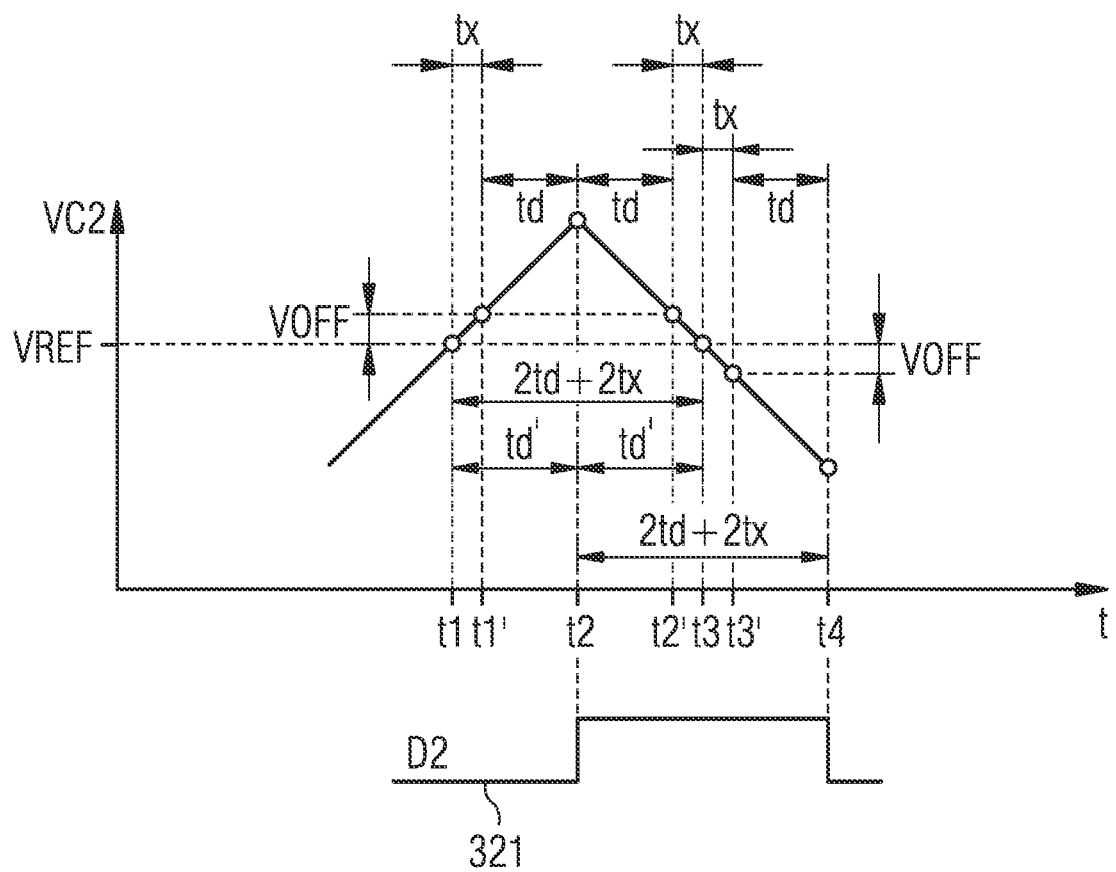

FIG. 5 shows the case when the systematic offset voltage VOFF is present at the input of the comparators, e.g comparators 251 and 252. Voltage VC2 is shown, together with the pulse 321 of the measurement signal D2. In this case, the comparator 251 needs the additional time tx for the activation of the signal B1, because the offset voltage VOFF is added to the reference voltage VREF. The expression for the additional time tx is equal to the offset voltage VOFF divided by the slew rate of the voltage VC2, being equal to $$tx=VOFF*C/IREF$$

wherein tx represents the additional time tx and VOFF represents the offset voltage VOFF.

The time difference between t2 and t1' is equal to the delay time td of the comparator. The time difference between t1 and t2 is referred to as the effective delay td' of the comparator which is the comparator propagation delay td plus the delay tx caused by the offset of the comparator and is equal to $$t2-t1=td+tx=td'$$

wherein td' represents the effective delay td' of the comparator.

Because of the symmetry of the slew rates of the voltage VC2, the difference between t2' and t2 is equal to the delay time td, and the difference between t3 and t2' is equal to the additional time tx. Consequently, the difference between t3 and t2 is equal to the difference between t2 and t1, i.e. the sum of the delay time td and the additional time tx.

Since the comparator 252 has the inverted phase, the offset voltage VOFF is effectively subtracted from the reference voltage VREF. Similar as before, the additional time tx is needed from t3 to t3' for the activation of the signal B2. From t3' the delay time td is needed until the output voltage B2 of comparator 252 reaches the threshold voltage VTHR at the moment t4. In this way, the pulse 321 of the measurement signal D2 is determined with the duration $$t4-t2=2*(td+tx)=2td'$$

It can be concluded that the pulse duration is always equal to two times the effective delay, i.e. the delay time relative to the moment when voltage VC2 reaches VREF. As a result, any influence of the systematic offset voltage VOFF on the duration of the oscillation period is also canceled in the proposed oscillator circuit.

It is to be understood that any feature described in relation to any one embodiment may be used alone, or in combination with other features described, and may also be used in combination with one or more features of any other of the embodiments, or any combination of any other of the embodiments unless described as alternative. Furthermore, equivalents and modifications not described above may also be employed without departing from the scope of the oscillator circuit and method which are defined in the accompanying claims.

We claim:

1. An oscillator circuit comprising:
   a first integrator-comparator unit,
   a second integrator-comparator unit, and
   a logic circuit,
   wherein the first integrator-comparator unit is prepared to provide a first signal as a function of a first integration of a first charging current and a subsequent comparison of a first integration signal resulting from the first integration with a reference signal, the first integrator-comparator unit further being prepared to provide a second signal which is complementary to the first signal,
   wherein the second integrator-comparator unit is prepared to provide a third signal as a function of a second integration of a second charging current and a subsequent comparison of a second integration signal resulting from the second integration with the reference signal, the second integrator-comparator unit further being prepared to provide a fourth signal which is complementary to the third signal,
   and wherein the logic circuit is adapted to provide a clock signal, a first and a second measurement signal for respectively controlling the first and the second integrator-comparator unit, wherein the first measurement signal is provided as a function of the second signal and the clock signal, the second measurement signal is provided as a function of the fourth signal and the clock signal and the clock signal is provided as a logic function of the first signal and the third signal.

2. The oscillator circuit according to claim 1, wherein the second integrator-comparator unit is controlled to perform the second integration in counter-phase to the first integration.

3. The oscillator circuit according to claim 1, wherein
   a width of an impulse of the first measurement signal is proportional to a propagation delay of the comparison within the first integrator-comparator unit, and a width of an impulse of the second measurement signal is proportional to a propagation delay of the comparison within the second integrator-comparator unit.

4. The oscillator circuit according to claim 1,
wherein a value of the first charging current and a value of the second charging current is respectively adjusted under control of the logic circuit by means of the first and the second measurement signal and the clock signal.

5. The oscillator circuit according to claim 1,
wherein the first integrator-comparator unit comprises
a first charger component,
a first capacitor, and
a first comparator and a second comparator, wherein a noninverting input of the first comparator is coupled to an inverting input of the second comparator thereby forming a first integration node, and wherein an inverting input of the first comparator and a noninverting input of the second comparator are supplied with the reference signal,
wherein the first capacitor is connected between the first integration node and a reference potential terminal, and
wherein the first charger component is switchably coupled to the first integration node, the first comparator is prepared to provide the first signal, and the second comparator is prepared to provide the second signal.

6. The oscillator circuit according to claim 5,
wherein the first charger component comprises
a first switch, a second switch, a third switch and a fourth switch, and
a first current source coupled between a supply potential terminal and the first integration node by means of the first switch,
a second current source coupled between the supply potential terminal and the first integration node by means of the second switch, and
a third current source coupled between the first integration node and the reference potential terminal by means of the fourth switch,
wherein the first integration node is coupled to the reference potential terminal by means of the third switch, and the first charger component is prepared to provide the first charging current.

7. The oscillator circuit according to claim 6,
wherein the first switch is controlled by the clock signal in its inverted form,
the second switch is controlled by the second measurement signal,
the third switch is controlled as a function of the first measurement signal and the clock signal in its inverted form, and
the fourth switch is controlled by the first measurement signal.

8. The oscillator circuit according to claim 1,
wherein the second integrator-comparator unit comprises
a second charger component,
a second capacitor, and
a third comparator and a fourth comparator, wherein a noninverting input of the third comparator is coupled to an inverting input of the fourth comparator thereby forming a second integration node, and wherein an inverting input of the third comparator and a noninverting input of the fourth comparator are supplied with the reference signal,
wherein the second capacitor is connected between the second integration node and the reference potential terminal, and
wherein the second charger component is switchably coupled to the second integration node, the third comparator is prepared to provide the third signal, and the fourth comparator is prepared to provide the fourth signal.

9. The oscillator circuit according to claim 8,
wherein the second charger component comprises
a fifth switch, a sixth switch, a seventh switch and an eighth switch, and
a fourth current source coupled between the supply potential terminal and the second integration node by means of the fifth switch,
a fifth current source coupled between the supply potential terminal and the second integration node by means of the sixth switch, and
a sixth current source coupled between the second integration node and the reference potential terminal by means of the eighth switch,
wherein the second integration node is coupled to the reference potential terminal by means of the seventh switch, and the second charger component is prepared to provide the second charging current.

10. The oscillator circuit according to claim 9,
wherein the fifth switch is controlled by the clock signal, the sixth switch is controlled by the first measurement signal,
the seventh switch is controlled as a function of the second measurement signal and the clock signal, and
the eighth switch is controlled by the second measurement signal.

11. The oscillator circuit according to claim 1,
wherein the logic circuit comprises
a flip-flop which is prepared to receive the first and the third signal on its inputs and to provide the clock signal.

12. The oscillator circuit according to claim 11,
wherein the logic circuit further comprises
a first logic component which is prepared to receive the second signal and the clock signal and to provide the first measurement signal, and
a second logic component which is prepared to receive the fourth signal and the clock signal in its inverted form and to provide the second measurement signal.

13. A method for generating a clock signal comprising:
integrating a first charging current in a first integration,
comparing a first integration signal resulting from the first integration with a reference signal and therefrom providing a first signal,
providing a second signal which is complementary to the first signal,
integrating a second charging current in a second integration,
comparing a second integration signal resulting from the second integration with the reference signal and therefrom providing a third signal,
providing a fourth signal which is complementary to the third signal,
providing a clock signal as a logic function of the first and the third signal,
providing a first measurement signal as a function of the clock signal and the second signal,
providing a second measurement signal as a function of the clock signal and the fourth signal, and
controlling the first integration and the second integration by means of the clock signal, the first and the second measurement signal.

14. The method for generating a clock signal according to claim 13, wherein the first integration is performed in counter-phase to the second integration under control of the clock signal.

15. The method for generating a clock signal according to claim 13,
wherein the first measurement signal changes its state as soon as the first signal surpasses a threshold level and subsequently changes its state again as soon as the second signal surpasses the threshold level such that a duration of an impulse of the first measurement signal is proportional to a propagation delay of the comparing the first integration signal with the reference signal, and
wherein the second measurement signal changes its state as soon as the third signal surpasses the threshold level and subsequently changes its state again as soon as the fourth signal surpasses the threshold level such that a duration of an impulse of the second measurement signal is proportional to a propagation delay of the comparing the second integration signal with the reference signal.

16. The method for generating a clock signal according to claim 13,
wherein a value of the first charging current is adjusted under control of the first and the second measurement signal and the clock signal in its inverted form such that a slew rate of the first integration signal between a point in time at which the first integration signal surpasses the reference signal and the point in time at which the clock signal changes its state is adjusted to a slew rate of the first integration signal between the point in time at which the clock signal changes its state and a point in time at which the first integration signal falls below the reference signal,
and
wherein a value of the second charging current is adjusted under control of the first and the second measurement signal and the clock signal such that a slew rate of the second integration signal between a point in time at which the second integration signal surpasses the reference signal and the point in time at which the clock signal changes its state is adjusted to a slew rate of the second integration signal between the point in time at which the clock signal changes its state and a point in time at which the second integration signal falls below the reference signal.

* * * * *